United States Patent [19]

Ruszczyk et al.

[11] Patent Number: 4,761,303

[45] Date of Patent: Aug. 2, 1988

[54] PROCESS FOR PREPARING MULTILAYER PRINTED CIRCUIT BOARDS

[75] Inventors: Stanley J. Ruszczyk, Naugatuck; Donald R. Ferrier, Thomaston; Gary B. Larson, Cheshire, all of Conn.; Daniel Gallegos, Anaheim, Calif.; Steven A. Castaldi, Waterbury, Conn.

[73] Assignee: MacDermid, Incorporated, Waterbury, Conn.

[21] Appl. No.: 929,640

[22] Filed: Nov. 10, 1986

[51] Int. Cl.$^4$ ............. B05D 5/12; B05D 3/04; H05K 1/00
[52] U.S. Cl. ......................... 427/96; 427/97; 427/98; 427/304; 427/305; 174/68.5; 428/901
[58] Field of Search .............. 427/96, 97, 98, 304, 427/305; 204/20, 30; 174/68.5; 428/901

[56] References Cited

U.S. PATENT DOCUMENTS

| | | | |
|---|---|---|---|
| 3,146,125 | 8/1964 | Schneble et al. | 427/98 |
| 3,993,801 | 11/1976 | Feldstein | 427/98 |
| 4,526,807 | 7/1985 | Auerbach | 427/96 |
| 4,565,606 | 1/1986 | Cassat | 204/20 |
| 4,590,115 | 5/1986 | Cassat | 427/306 |
| 4,629,681 | 12/1986 | Takada et al. | 427/96 |

*Primary Examiner*—Norman Morganstern
*Assistant Examiner*—Margaret Burke

*Attorney, Agent, or Firm*—St.Onge Steward Johnston & Reens

[57] ABSTRACT

Multilayer printed circuit boards are fabricated by preparing a first layer in conventional manner by forming a resist image on a copper clad substrate, etching away unwanted copper, removing the resist from the circuit pattern and optionally applying a dielectric mask such as conventional solder mask to selected portions of the circuit pattern. A second layer, and optionally one or more subsequent layers, are fabricated by providing an image of a second circuit pattern in a predetermined location on said first layer, the image being formed using a suspension of cuprous oxide in a curable resin material. The image is cured at least partially and subjected to chemical reduction to convert at least a portion of the cuprous oxide to metallic copper such that the unreduced cuprous oxide in resin serves as a dielectric layer. The image is then electrolessly plated with copper to build up the circuit pattern and the latter is selectively coated with a dielectric mask before repeating the cycle to build up one or more additional layers. Solder can be applied to selected areas of any of said printed circuit layers at any appropriate time during fabrication.

The above method of fabrication has advantages of economy of time, materials and labor as compared with methods hitherto employed to prepare multilayer boards in which a plurality of single boards are fabricated individually and then assembled as a sandwich or laminate by application of heat and pressure.

28 Claims, No Drawings

PROCESS FOR PREPARING MULTILAYER PRINTED CIRCUIT BOARDS

BACKGROUND OF THE INVENTION

1. Field of the Invention

This invention relates to an improved process for fabrication of printed circuit boards and to the boards so prepared and is more particularly concerned with a process for fabrication of multilayer printed circuit boards by printing each consecutive layer on the preceding layer, and with the multilayer boards so produced.

2. Description of the Prior Art

Multilayer printed circuit boards are currently prepared by a rather complex process in which a plurality of single boards are prepared separately and then laminated together using heat and pressure. Generally the individual boards, which can be prepared by any of the procedures conventionally employed for single printed circuit boards, are provided with tooling holes to assure good registration during imaging and lamination. Optionally, but preferably, the copper circuitry on the boards is coated with a layer of black copper oxide to improve adhesion of the board to an epoxy prepreg sheet which is to be interposed between adjacent boards prior to lamination. The layers are arranged in proper sequence and registration with epoxy or like resin prepregs (usually reinforced with fiberglass and the like) interleaved and separating each board from its neighbors. The stack of boards and prepregs is held between the cauls (preferably preheated) of a press and subjected to pressure and heat for a time and at a pressure such that adhesion is achieved. Generally the laminate is subjected to postcure at an elevated temperature. The resulting laminate must be drilled and any epoxy resin which has become smeared in the drill holes is cleaned out. Electroless copper plating of the holes is then carried out to achieve electrical connection between the various layers of circuitry. As will be readily apparent, the accuracy of registration of the circuitry in the layers as well as the accuracy of drilling are critical factors in achieving satisfactory performance of the resulting board. One of the many difficulties inherent in this process lies in the tendency of the various single boards to float on the softened epoxy or other resin employed in the prepreg and to move out of correct registration. Another problem lies in the difficulty of ensuring that all resin smears have been cleaned from the holes drilled through the finished laminate. Difficulties can also arise as to achieve uniformity of pressure across the boards during the lamination process.

This invention is directed to a novel process for the fabrication of multilayer printed circuit boards which process avoids the necessity to laminate a series of single boards and thereby avoids the major problems inherent in the lamination process as discussed above. The principal feature of the novel process of this invention is that the multilayer board is built up gradually by forming each layer in situ on the previously formed layer, and with its circuitry properly oriented with respect to that of the previous layer. Thus, the circuitry in each layer is formed by depositing on the previous layer a circuit pattern formed from a non-conductive suspension of a metal oxide in a curable resin, subjecting the particles of metal oxide at or near the surface of said pattern to chemical reduction to form conductive metal particles which can then receive a coating of electroless copper thus forming the desired circuit pattern. The unreduced metal oxide particles remaining in the interior of the resin serve to insulate dielectrically the newly formed and plated circuit pattern from that in the previous layer except at the interconnections between the two circuitry patterns at predetermined locations.

The metallization of substrates, by coating of the substrate with a suspension of a metal oxide in a resinous material followed by chemical reduction of at least some of the particles of metal oxide to metal thereby rendering the surface sufficiently conductive to be electrolessly plated with metal, has been described previously. Thus, Schneble et al U.S. Pat. No. 3,146,125 describes forming a printed circuit board by coating a substrate with a suspension of cuprous oxide particles in a resin, producing an image of a circuit pattern on the resin layer using a resist, reducing the cuprous oxide particles (or at least those nearest the surface) in the exposed circuit pattern and adding additional copper thickness by electroless plating of the circuit pattern now made conductive by the reduced copper particles.

Schneble et al U.S. Pat. No. 3,347,724 describes a similar process used with a flexible substrate which may also contain through-holes. Both patents teach the use of acids, preferably sulfuric acid, as the reducing agent for the cuprous oxide. Such techniques suffer the disadvantage that disproportionation occurs resulting in equimolar amounts of metallic copper and the copper salt of the acid used. The result is that the density of metallic copper particles per unit surface is limited and the addition of further copper is limited to the electroless rather than the electroplating method. Further the use of the technique with boards containing through-holes is difficult because of the need to clear excess resin from the holes as well as the difficulty of achieving buildup of an adequate level of copper in the through-holes after reduction of the cuprous oxide.

Letter et al U.S. Pat. No. 3,551,304 teach a related technique of printing a circuit on a glass substrate by coating the latter with a layer of tin oxide, masking predetermined areas, reducing the tin oxide to tin in the exposed areas, removing the mask and unreduced tin oxide from the masked areas, and, optionally, plating the tin circuit pattern.

Polichette et al U.S. Pat. No. 3,772,056 describe the metallization of substrates by coating the latter with a layer of a metal salt, reducing the salt to form a layer of non-conductive metal by radiant energy or chemical reducing agents, then electrolessly depositing metal on the areas containing reduced metal. Printed circuits are among the metallized substrates which can be produced in this manner and the production of printed circuit boards is the subject of companion U.S. Pat. No. 3,907,621 which issued on a continuation-in-part of the application which gave rise to the '056 patent. Polichette et al U.S. Pat. No. 3,772,078 is directed to the production of a selected pattern of non-conducting metallic nuclei using the above process but employing a radiation-sensitive reducing agent in conjunction with a secondary reducer in acid medium in order to reduce the metallic salt. Companion U.S. Pat. No. 3,930,963, based on a continuation-in-part of the application on which the '078 patent issued is directed to the preparation of printed circuit boards using the process described in the '078 patent.

Polichette et al U.S. Pat. No. 3,956,041 describes a transfer process for applying a layer of resin, optionally containing cuprous oxide particles suspended therein, to a substrate.

Cassat et al U.S. Pat. No. 4,564,424 teach the formation of conductive metallized surfaces on polymeric film substrates by depositing on the latter a suspension of particles of a metal oxide such as cuprous oxide in a film-forming polymer matrix, disrupting the surface of the layer so deposited, for example, by stretching or drawing the film substrate, and then chemically reducing the exposed metal oxide particles to form a layer of electrically conducting metal particles on to which further metal can be electrodeposited. In companion U.S. Pat. No. 4,565,606 the process of the '424 patent is applied to the metallization of a polyimide/polyamide film substrate.

Cassat U.S. Pat. No. 4,590,115 describes the preparation of a plastic article metallized on at least one side. The article is first molded into the desired shape using a polymeric resin having a high density of metal oxide particles uniformly suspended therein. At least one surface of the article is then subjected to the action of a chemical reducing agent to form a layer of free metal particles on said surface and additional metal is then electrodeposited on the surface which has been made electrically conducting by the reduction step.

It has not been suggested previously that the technique of forming metallized layers or circuit pattern images using suspensions of metal oxide particles in a resin followed by reduction of the metal oxide to metal could be employed in the preparation of multiple layer printed circuit boards. Nor has it been recognized that the inner layers of such boards could be produced by techniques other than manufacture of a plurality of individual boards which must then be carefully assembled in registry one with another each board being separated from its neighbors by a layer of material such as reinforced epoxy resin before being laminated together by heat and pressure. It has now been found that the layers of a multiple circuit board can be produced in situ by a sequence of steps which do not involve a heat and pressure lamination nor an etching process in the individual layers and which thereby possess marked advantages over the processes previously employed. Additional advantages which are a characteristic of the process of this invention will become apparent from the detailed description which follows.

SUMMARY OF THE INVENTION

It is an object of the invention to produce multilayer printed circuit boards by a process which avoids the use of heat and pressure lamination of an assembly of individually preformed printed circuit boards.

It is a further object of the invention to produce a multilayer printed circuit board wherein the layers are formed sequentially in situ, i.e., each layer is formed in situ on the previously formed layer, and in predetermined registry with the previously formed layer.

It is yet another object of the invention to produce a multilayer printed circuit board wherein each of the layers is separated and electrically insulated from its neighbors by an intermediate non-conducting layer comprising a suspension of particles of a non-conducting metal oxide in a resinous medium.

It is also an object of the invention to produce a multilayer printed circuit board in which the layers are produced without the need for etching in forming the circuit patterns.

These objects, and other objects of the invention which will become apparent from the description which follows, are achieved by the process of the present invention. In its broadest aspect the process of the invention comprises forming a first layer of the desired board by conventional techniques such as hereinafter described and then forming the second and any subsequent layers by providing on the previously formed layer an image of a second circuit pattern which image is formed using a suspension, in a curable resinous material, of particles of a non-conductive metal derivative capable of being chemically reduced to electrically conductive free metal. The image is then at least partially cured before being subjected to chemical reduction to convert at least a portion of said metal derivative in the surface of the image to free metal thereby rendering the image receptive to electrolessly plating with copper to form the circuit pattern with the desired thickness of copper and having excellent adhesion to the substrate. Finally, if desired, the copper of the circuit pattern, or preselected portions thereof, is coated with solder mask before proceeding to repeat the above sequence of steps to form the next layer of the multilayer board.

In a preferred embodiment of the process of the invention each layer is produced by coating the entire surface of the previously formed layer with a layer of the suspension of non-conductive metal derivative particles in resin. The desired image of the next circuit pattern is then formed on said layer by providing an appropriate mask of resist material which leaves exposed only the image of the circuit pattern. The exposed image is subjected to chemical reduction to reduce the metal derivative particles in the surface of the image to free metal and facilitate electroless deposition of copper on the image of the circuit pattern. The layer of the suspension of non-conductive metal derivative particles in resin which is placed between the printed circuit layers in the above manner serves to insulate the latter one from another except in those predetermined areas in which electrical connection between the circuits is desired.

The invention also comprises the multilayer circuit boards produced in accordance with the process of the invention.

The term "non-conductive metal derivative capable of being chemically reduced to electrically conductive free metal" means derivatives of non-precious metals such as copper, nickel, cobalt, lead, cadmium, chromium, antimony, tin and the like, which derivatives are not themselves electrically conducting but will undergo facile reduction by borohydrides, and like reducing agents hereinafter described, to give the electrically conductive free metal. Illustrative of such derivatives are cuprous oxide, cupric hydroxide, cupric carbonate, and the oxides of divalent lead, cobalt, nickel and cadmium, trivalent chromium and antimony and tetravalent tin. Preferred non-conductive metal derivatives for use in the process of the invention are cuprous oxide, cupric hydroxide and cupric carbonate. Most preferred is cuprous oxide and this particular derivative will be utilized in the following detailed description of the invention. It is to be understood however that this is done in the interest of brevity and the scope of the present invention is not to be construed as limited to the use of this particular derivative.

DETAILED DESCRIPTION OF THE INVENTION

In carrying out the preparation of multilayer printed circuit boards in accordance with the invention the first layer is provided using techniques conventional in the art for fabrication of single or double-sided printed circuit boards. Illustratively, this first board is prepared by providing a copper clad substrate, such as reinforced epoxy board to both sides of which has been laminated a sheet of copper foil, and which has through-holes drilled therein in preselected locations. The through-holes are generally plated with copper by electroless deposition and additional copper is then electroplated on both the foil and plated through-holes to build up any desired thickness of copper. In a particular embodiment of the invention the copper clad substrate which is employed to prepare the first layer of the board is fabricated in the following manner. A reinforced epoxy board or like non-conducting board which has been drilled with holes in preselected locations, is coated with a layer of a suspension of finely divided particles of cuprous oxide in a curable resinous material, which suspensions are described more fully hereinafter. The coating is effected in any known manner such as roller coating, spin coating, spraying and the like. Spraying is the preferred method of application since, by appropriate adjustment of spraying pressure it is possible to coat the surface of the board and the walls of the drilled holes without completely blocking the latter. The coating so applied is then cured, at least partially, by heating at the curing temperature of the resin before being submitted to chemical reduction, using techniques and compositions described hereinafter, to convert the cuprous oxide particles in the surface of the coating to metallic copper. Finally the board is plated electrolessly with copper using conventional electroless plating techniques to build up the desired thickness of copper on the board and in the through-holes. The board can be provided with a layer of copper on one or both sides using the above technique.

Whichever method of preparing the copper clad substrate is employed the next step in fabrication of the first layer of the board is carried out as follows. A resist image of a desired circuit pattern is then formed on one or both sides of the board. The resists, including inks, employed for this purpose can be applied in the required image pattern by stencil, screen printing or other known methods. Generally, the resist will be a photosensitive type (negative or positive-acting) and can be of the dry film or liquid type. Where a photoresist is employed to produce the required image pattern the substrate is coated with a layer of photoresist, the latter is exposed to actinic radiation via a positive or negative image (depending on the nature of the photoresist) and the resulting image is developed using an appropriate solvent which dissolves the exposed portion of the resist in the case of the positive photoresist and the unexposed portion in the case of the negative photoresist. The copper surface which is left exposed in the imaging process is then removed by etching using any of the conventional etchants known in the art. The photoresist is subsequently removed by dissolution in appropriate solvents or by any other conventional techniques thereby exposing the copper circuit pattern. The latter, or selected portions of the latter, is then covered with a dielectric mask for the circuitry such as a conventional solder mask advantageously by stencilling, screen-printing and like techniques.

The second layer of circuitry in the multilayer board is then prepared in situ on the surface of the first board using the following procedure. An image of the second layer circuit pattern is formed in predetermined registration with the circuitry in the first board using a suspension of finely divided particles of cuprous oxide in a curable resinous material. Illustrative of curable resins which can be employed as the carrier in the cuprous oxide suspension are thermosetting resins such as phenolic resins including the novolak type resins formed by condensation of phenol, resorcinol, cresol and the like with formaldehyde, furfural and the like; unsaturated polyester resins such as those derived from an unsaturated polycarboxylic acid including maleic, fumaric, citraconic and like acids, and a polyalkylene glycol; and epoxy resins such as the reaction product of epichlorohydrin (1-chloro-2,3-epoxypropane) or 1,2,3,4-diepoxybutane with bisphenol A, resorcinol, hydroquinone, 1-5-dihydroxynaphthalene and the like.

The preferred resins for use in accordance with the invention are epoxy resins and a particularly preferred group of resins are epoxy resins derived from Bisphenol A.

The cuprous oxide employed in suspension in the curable resin should be present in finely divided particulate form. Advantageously the cuprous oxide has an average particle size of about 3 to 25 microns and preferably has an average particle size of about 4 to 7 microns.

The proportion of cuprous oxide in the suspension in the curable resin can vary over wide limits from about 50 percent to about 80 percent by weight based on total weight of the suspension. Preferably the cuprous oxide is employed in a concentration of about 70 percent to about 75 percent by weight. The suspension is prepared in any convenient manner by intimately mixing the ingredients using methods and equipment conventional in the art.

The suspension of cuprous oxide in curable resin may also comprise catalysts for curing of the resins and additives of the type used in paints such as modifiers, thixotropic agents, levelling agents, fillers, pigments and the like, if desired. The suspension of cuprous oxide may also be diluted up to about an equal point by volume with a solvent or mixture of solvents such as ketones, glycol ethers, glycol ether esters, aromatic hydrocarbons and the like.

The circuit pattern image can be formed using the cuprous oxide suspension in one of a number of ways. Illustratively the image can be deposited in the desired configuration and predetermined relationship vis-a-vis the circuitry in the first layer by stencil or by silkscreen and like printing techniques. The image is then cured at least partially, prior to carrying out the next step the curing being carried out as described below depending upon the nature of the resin. Alternatively, the image can be produced by coating the substrate (first board) with a layer of the cuprous oxide suspension in which the resinous carrier is a photoresist (either positive or negative) and the image exposed thereon and developed in the conventional manner.

In another alternative and preferred method of forming the image, the entire surface of the first board is coated with a layer of the cuprous oxide suspension in a resin which is not part of a photoresist system. The coating can be carried out by any conventional technique but is preferably applied by stencil or silk screening to avoid having to remove excess material from through-holes. A resist material, i.e., a material which is resistant to attack in the subsequent chemical reduction step to be described below, is then selectively applied to those areas of the cuprous oxide layer which do not form part of the desired circuit pattern image, thus leaving the latter image exposed. In general the resist can be any of those employed in formation of the circuit pattern on the first board as described above. Prior to application of the resist the underlying layer of cuprous oxide suspension is cured, at least partially, to the solid state. The method by which the curing is effected depends upon the nature of the particular resin employed. In many cases the curing is carried using heating alone but in other cases, such as epoxy resins and the like it is necessary to incorporate a catalyst or curative into the resin composition prior to application to the surface of the board. Any of the conventional catalysts or hardeners known in the art for use with the particular resin can be employed in the above curing process.

The advantage of using the above preferred method of forming the circuit image is that the suspension of cuprous oxide in the resinous material is intrinsically non-conducting and therefore serves to insulate the new circuit which is to be formed from that on the first board.

In the next step of the process of the invention the image formed in any of the ways described above is subjected to the action of a chemical reducing agent wherein the particles of cuprous oxide which are present in, or adjacent to, the surface of the image are reduced to metallic copper. Provided that the concentration of cuprous oxide, and hence of metallic copper produced therefrom, is appropriately chosen the surface of the image may become conducting to an extent such that additional copper can be plated thereon by electrolytic deposition using conventional techniques and equipment. In general, however, the presence of metallic copper in the surface of the image facilitates the further deposition of copper therein by electroless plating techniques and ensures that excellent adhesion of the electroless copper to the image takes place.

The reducing agents which are employed in conversion of the cuprous oxide to copper are inclusive of boron compounds such as dimethylaminoborane and the like disubstituted amino boranes, and alkali metal borohydrides in which up to 3 hydrogen atoms have been substituted by alkyl, alkoxy, aryl and like radicals. Illustrative of such borohydrides are sodium borohydride, potassium borohydride, sodium diethylborohydride, sodium trimethoxyborohydride, potassium triphenylborohydride and the like.

The reduction step is carried out conveniently by bringing the substrate into contact with a solution of the reducing agent in water or a mixture of water and a lower aliphatic alcohol. Advantageously the substrate is immersed in a bath of the solution for a time sufficient to achieve conversion of the cuprous oxide particles in the surface layer of the image to metallic copper but insufficient to cause reduction of all cuprous oxide particles in the image. The appropriate amount of time necessary in any given instance can be readily determined by a process of trial and error. The concentration of reducing agent employed in the solution is advantageously of the order of about 0.2 percent to about 0.6 percent weight by weight and preferably of the order of about 0.2 to about 0.3 percent weight by weight. The reduction can be carried out at elevated temperatures up to about 55° C. but is preferably carried out at ambient temperatures in the range of about 15° C. to about 30° C.

When the reduction step is completed the cuprous oxide particles in the surface of the circuit pattern image have been converted to metallic copper. The resulting board is subjected to electroless deposition of copper to build up (full-build) the required thickness of copper on the circuit pattern. Any of the methods and compositions conventionally employed in the art of electroless deposition of copper can be used in this step. Illustrative of such methods and compositions are those described by Raymond H. Clark, Handbook of Printed Circuit Manufacturing, pp 300–324, Van Nostrand Reinhold Company, New York, 1985.

When the electroless plating of the circuit is complete the resist layer remaining on the board can be removed, if desired, using appropriate solvents or alternatively can be left in place permanently. Solder mask or like dielectric mask is then applied to selected areas of the newly formed circuit by screen printing and like techniques. The final step in the formation of the layer is the application of solder to pads and any other desired location, using procedures well-known in the art.

One or more additional layers of circuitry may then be formed in situ on the above layer by repetition of all the steps outlined above for the formation of the second layer. Further, where the first formed board had circuitry printed on both sides, one or more additional layers can be formed on each side of the board either simultaneously or separately. There is thus built-up a multilayer printed circuit board in which the innermost layer is formed by conventional methods such as those described above and all subsequent layers on both sides of this innermost board are built-up sequentially in situ using the process of this invention.

As will be apparent to one skilled in the art the process of preparation of multilayer printed circuit boards which is the subject of the present invention is possessed of very significant advantages. Thus the only layer of the board which requires an etching step is the first formed board. Further each of the subsequent layers is applied in predetermined relationship with respect to the previous layer thus ensuring the precise registration of each layer with its neighbors. This contrasts vividly with the difficulties previously discussed which are normally encountered in laminating preformed individual layers one to another in perfect registration.

The method of the invention is also free from the difficulties caused by failure or problems in removing material smeared in through-holes during the drilling of the same in the case of laminated boards. An additional advantage lies in the dual role which can be played by the suspension of cuprous oxide in curable resinous material. Thus the latter can be utilized to form the desired image of a circuit pattern and at the same time, by reason of its intrinsic non-conductivity, can be used to insulate each layer of the board from its neighbors.

A further advantage inherent in the process of the invention is that when the suspension of cuprous oxide is reduced the metallic copper formed in the surface of the image which overlaps the copper plated throughholes or pads in the previously formed layer produces a weld between the newly formed image and the copper circuit in the previous layer.

It will be understood that modifications can be made to the embodiments that have been described above, especially through substitution of equivalent non-noble metal oxides, such as nickel, cobalt, lead, cadmium, chromium, antimony and tin oxides or cupric hydroxide or carbonate for the cuprous oxide employed in the above-described process. In a particular modification of the process of the invention the image of each circuit pattern can be produced by employing a suspension of cuprous oxide particles in a photoresist resin followed by exposure imagewise and development of the image employing an appropriate solvent. Where this technique is employed the separation of the individual circuit layers by a non-electrically conducting layer is achieved by application of a layer of solder mask and the like dielectric masks on to each layer prior to image formation.

In a further modification of the process of the invention the first layer of the multiple layer board is formed in the manner described above and then subsequent layers are formed by coating the preceding layer with a suspension of cuprous oxide in curable resin, partially curing the resin, reducing the cuprous oxide particles to copper in the surface of the coating, electrolessly plating the resulting surface of the coating with additional copper, then forming a resist image of the desired circuit pattern on the copper layer formed and etching away the copper in the exposed surface. In such embodiments the layer of cuprous oxide in the curable resin acts as the insulating layer between layers of circuitry in the multiple layer board.

The following examples illustrate the process of the invention and the best mode known to the inventors of carrying out the same but are not to be construed as limiting.

EXAMPLE 1

A multilayer circuit board in accordance with the invention is fabricated as follows.

A fiberglass reinforced epoxy board having copper foil laminated on both sides thereof is drilled to provide through-holes in selected locations. The drilled board is then placed in an electroless copper plating bath [Macuplex ® 9027: MacDermid, Inc., Waterbury, Ct.] for a period of 30 minutes at 110° F. to buildup the layer of copper on the foil and in the through-holes to a thickness of about 0.1 mils. A layer of dry film photoresist [Riston 3620: Riston Products Div. of DuPont] is then applied to each side of the board. The through-holes are simultaneously tented over by the dry film resist during the application of the latter. The photoresist layers are then each in turn exposed to actinic radiation via an appropriate image and the image is developed using a 2 percent w/v sodium carbonate solution. The copper not covered by the resist image is then etched away by immersing the board in a commercial etching bath [Ultraetch 50: MacDermid, Inc.]. After rinsing the board with water and drying the same, the resist is removed by immersion in a bath of 3 percent w/v aqueous sodium hydroxide. The resulting board is spin coated on both sides with a layer of a 70% w/w suspension of particles of cuprous oxide (average particle size about 5 microns) in an epoxy derivative of Bisphenol A containing 12 parts per 100 parts of triethylene tetramine catalyst. The average thickness of the layer so applied is about 2.0 mils. The layers so applied are cured by heating at 275° F. for a period of 60 minutes after which an image of a circuit pattern is applied to each layer by screen printing using a liquid photoresist [2100: available from MacDermid, Inc.] followed by imagewise exposure and development. The cuprous oxide in the surface of the layer which remains exposed in the images so formed is then reduced to metallic copper by immersing the board in an aqueous solution containing 2 grams per liter of dimethylaminoborane and 76.5 grams per liter of sodium hydroxide. The solution is maintained at 75 to 80° F. and the board is held in the solution for approximately 5 minutes after which it is removed, rinsed with water and dried. Thereafter the board is placed in an electroless copper plating bath [Macuplex 9027] for a period of about 30 minutes using a bath temperature of about 75° F. to plate the reduced cuprous oxide image pattern with copper to an average depth of about 0.1 mils.

The resulting copper plated circuit pattern images on both sides of the board are then coated with solder mask [9483; MacDermid, Inc.] using screen printing. A further layer of circuitry is then applied to one or both sides of the board by repeating the process described above for application of the second layer.

EXAMPLE 2

The process described in Example 1 is repeated to the stage at which the etching step is complete and the resist is removed. When this stage has been reached an image of a circuit pattern is screen printed on one side of the board using the same suspension of cuprous oxide in resin employed in Example 1. The image is cured by heating at about 275° F. for 60 minutes and the cuprous oxide particles in the surface of the image are reduced to metallic copper by immersion in an aqueous bath containing dimethylaminoborane and sodium hydroxide in the same concentrations as employed in the reducing bath in Example 1. The resulting image with metallic copper in the surface thereof is then plated with copper by placing the board in an electroless copper plating bath [Macuplex 9027] for a period of 30 minutes at a temperature of 75° F. The average depth of copper so plated is about 0.1 mil. The resulting board with the copper trace pattern thereon is then covered with solder mask [9483; MacDermid, Inc.] by screen printing. The above process cycle is then repeated to produce a copper trace pattern on the opposite side of the circuit board.

EXAMPLE 3

A multilayer printed circuit board in accordance with the invention was prepared in accordance with the procedure of claim 1 with the exception that the starting copper clad drilled substrate was prepared as follows:

A fiberglass reinforced epoxy board with holes drilled therethrough at selected locations was carefully sprayed with a coating obtained by mixing (a) 12 parts by weight of a solution of 25 parts by weight of triethylene tetramine in 75 parts by weight of methyl ethyl ketone, with (b) 100 parts by weight of a 70-75 w/w suspension of cuprous oxide particles having average particle size about 5 microns in a Bisphenol A epoxide [Araldite 6010: Ciba-Geigy Corporation]. The spraying was carried out carefully using a pressure of about 30 psi so as to avoid blocking the drilled holes with spray. The coated board was cured by heating for 60 minutes at 275° F. The resulting coated board was then immersed in an aqueous solution containing 2 grams per liter of dimethylaminoborane and 76.5 grams per liter of sodium hydroxide. The solution was maintained at 75 to 80° F. and the board was held in the solution for approximately 5 minutes after which it was removed, rinsed with water and dried. Thereafter the board with metallic copper in the surface of the coating was placed in an electroless copper plating bath [Macuplex® 9027: MacDermid, Inc.] and held therein for 30 minutes at 75° F. before being rinsed with water and dried.

EXAMPLE 4

A multilayer printed circuit board in accordance with the invention is prepared using the process described in Example 1 up to the stage at which the layer of suspension of cuprous oxide is applied and the layer is cured by heating. Thereafter the cured layer is immersed directly in the reducing bath using the materials and technique described in Example 1 to convert the cuprous oxide particles in the surface of the cured layer to metallic copper. The resulting board is then removed from the reducing bath, rinsed with water and dried before being placed in an electroless copper plating bath [Macuplex 9027] for a period of about 30 minutes at a temperature about 75° F. to plate the reduced surface of the cuprous oxide layer with copper to a depth of about 0.1 mil. A layer of dry film photoresist [Riston 3620] is applied to each side of the board and, simultaneously, the through-holes are tented over. The photoresist layers are each in turn exposed to actinic radiation via an appropriate image and the image is developed using a 2 percent w/v aqueous sodium carbonate solution. Additional copper is built up on the exposed circuit traces in the resulting image by electroplating and thereafter tin/lead etch resist is applied to the copper circuit pattern. The photoresist is stripped away using 3 percent w/v aqueous sodium hydroxide, and the copper exposed by removal of the photoresist is etched away by immersing the board in a commercial etching bath (same as that used in Example 1). In a final step solder mask is applied selectively to the board by screen printing. The multilayer board so prepared has a dielectric layer between each layer of circuitry the dielectric being a suspension of the unreduced cuprous oxide particles in cured epoxy resin which had been applied over the first circuit layers on the board.

EXAMPLE 5

A fiberglass reinforced epoxy board with through-holes drilled at selected locations was carefully sprayed on each side with a coating of the suspension of cuprous oxide in epoxy resin using the same formulation and technique described in Example 3. The coated board was cured at 275° F. for 1 hour. One side of the board was screen coated with a layer of photoresist [ULTRAMAC ™ 2100: MacDermid Inc., diluted with dipropyleneglycolmethylether acetate at the rate of 7 parts by volume per 100 parts by volume of photoresist]. The board was heated at 250° F. for 10 minutes and then coated on the opposite with the same photoresist composition and again heated at 250° F. for 30 minutes. Each side of the board in turn was exposed via a circuit trace image to ultraviolet radiation and the image on each side was developed using butyl carbitol. After rinsing with cold water the board was post-baked at 250° F. for 20 minutes and finally cured by exposure to ultraviolet radiation. The cuprous oxide particles in the surface of the resulting circuit pattern image were reduced to metallic copper by immersing the board for 5 minutes in a reducing bath having the same composition as that described in Example 1. The board was then rinsed with cold water and placed in an electroless copper plating bath [Macuplex 9027] for 30 minutes at 75° F. to build up copper on the circuit pattern image having the reduced copper particles in the surface thereof.

Additional layers of circuitry are then added to the resulting board by repeating the above cycle of steps. Each of the layers so added is separated by a dielectric layer of cuprous oxide particles in epoxy resin which layer is produced in situ by the cycle of steps used in formation of the individual circuitry layers.

What is claimed is:

1. In a process for fabricating a multilayer printed circuit board wherein a first layer is fabricated by:
   providing a copper clad substrate with holes drilled therethrough, said holes being plated with copper;
   forming a resist image of a circuit pattern on said copper coated substrate;
   removing copper from the areas not covered by said resist;
   removing said resist; and
   applying a dielectric solder mask to selected portions of said circuit pattern;
   the improvement which comprises fabricating at least the second layer of said multilayer printed circuit board by;
   providing on said first layer an image of a second circuit pattern said image being formed using a suspension in a curable resinous material of particles of a non-conductive metal derivative capable of being chemically reduced to electrically conductive free metal;
   at least partially curing said image;
   subjecting said image to chemical reduction to convert at least a portion of said metal derivative in the surface of said image to free metal "such that the unreduced portion of said particles suspended in said resinous material serves as a dielectric layer";
   electrolessly plating said image with copper; and
   applying a dielectric mask to selected portions of said circuit pattern.

2. A process according to claim 1 wherein said suspension of non-conductive metal derivative is a suspension of cuprous oxide particles.

3. A process according to claim 2 wherein said image of said second circuit pattern is formed by applying a layer of said suspension of cuprous oxide in a curable resinous material to substantially the whole surface of said board and selectively applying material resistant to chemical reduction to said layer so as to leave exposed on said layer the desired circuit pattern.

4. A process according to claim 1 wherein said chemical reduction is carried out using an aqueous solution comprising dimethylaminoborane or an alkali metal borohydride.

5. A process according to claim 4 wherein the chemical reduction is carried out using an aqueous alkaline solution of dimethylaminoborane.

6. In a process for fabricating a multilayer printed circuit board wherein a first layer is fabricated by:
   providing a copper clad substrate with holes drilled therethrough, said holes being plated with copper;
   forming a resist image of a circuit pattern on said copper coated substrate;
   removing copper from the areas not covered by said resist;
   removing said resist; and
   applying a dielectric solder mask to selected portions of said circuit pattern;

the improvement which comprises fabricating at least the second layer of said multilayer printed circuit board by;

applying a layer of a suspension of cuprous oxide in a curable resinous material to substantially the whole surface of the board;

at least partially curing said layer;

selectively applying material resistant to chemical reduction to said layer so as to leave exposed on said layer the desired circuit pattern;

subjecting said exposed portions of said layer to chemical reduction to convert at least a portion of said metal derivative in the surface of said layer to free metal;

electrolessly plating said image with copper; and applying a dielectric mask to selected portions of said circuit pattern;

wherein the suspension of cuprous oxide in the curable resinous material applied to the surface of said first layer of said printed circuit board also serves as the dielectric layer between said first and second layers of circuitry.

7. In a process for fabricating a multilayer printed circuit board the steps comprising fabricating a first layer of said board by:

providing a copper clad substrate with holes drilled therethrough said holes being plated with copper;

forming a resist image of a circuit pattern on said copper coated substrate;

removing copper from the areas not covered by said resist;

removing said resist;

optionally applying a dielectric mask to selected areas of said circuit pattern so exposed;

applying over substantially the whole of said first layer a layer of a suspension of cuprous oxide in a curable resinous material;

at least partially curing said curable resinous material;

selectively applying material resistant to chemical reduction to said layer of cuprous oxide suspension so as to leave exposed on said layer a second circuit pattern;

subjecting said second circuit pattern to chemical reduction to convert at least a portion of the cuprous oxide in the surface thereof to metallic copper "such that the unreduced portion of said cuprous oxide in said curable resinous material serves as a dielectric layer";

electrolessly plating said second circuit pattern with copper; and applying a dielectric mask to the circuit pattern so produced.

8. A process according to claim 7 wherein one or more additional layers are fabricated on said board by repeating the steps employed in fabrication of said second layer.

9. A process according to claim 7 wherein said curable resinous material employed in said suspension of cuprous oxide is an epoxy derivative of Bisphenol-A.

10. In a process for fabricating a multilayer printed circuit board comprising the steps of:

forming the first layer by coating a non-conductive substrate having through-holes drilled therein with a layer of a suspension of cuprous oxide particles in a curable resinous material on each side of the substrate;

heat curing said layers;

subjecting said layers to chemical reduction to convert the cuprous oxide particles in the surface thereof to metallic copper;

and thereafter electrolessly plating said surfaces with copper;

forming a resist image of a circuit pattern on the copper coated substrate so preferred;

removing copper from the areas not covered by said resist; and removing said resist thereby forming the first layer of said printed circuit board;

applying over substantially the whole of said first layer a second layer of a suspension of cuprous oxide in a curable resinous material;

at least partially curing said curable resinous material;

selectively applying material resistant to chemical reduction to said layer of cuprous oxide suspension so as to leave exposed on said layer a second circuit pattern;

subjecting said second circuit pattern to chemical reduction to convert at least a portion of the cuprous oxide in the surface thereof to metallic copper; "such that the unreduced portion of said cuprous oxide in said curable resinous material serves as a dielectric layer";

electrolessly plating said second circuit pattern with copper; and optionally repeating one or more times the steps employed in fabrication of said second layer.

11. A process according to claim 7 wherein said material resistant to chemical reduction is applied by printing.

12. A process according to claim 7 wherein said chemical reduction is carried out using an aqueous solution comprising dimethylaminoborane or an alkali metal borohydride.

13. A process according to claim 12 wherein the chemical reduction is carried out using an aqueous alkaline solution of dimethylaminoborane.

14. A process according to claim 7 wherein said curing of said curable resinous material is carried out by heating said material.

15. In a process for fabricating a multilayer printed circuit board the steps comprising fabricating a first layer of said board by:

providing a copper clad substrate with holes drilled therethrough, said holes being plated with copper;

forming a resist image of a circuit pattern on said copper coated substrate;

removing copper from the areas not covered by said resist;

removing said resist;

optionally applying a dielectric mask to selected areas of said circuit pattern so exposed;

providing a second circuit pattern image on said first layer said image being formed using a suspension of cuprous oxide in a curable resinous material;

curing said image;

subjecting said image to chemical reduction to convert at least a portion of said cuprous oxide in the surface of said image to copper;

electrolessly plating said image with copper; and applying a dielectric mask to selected portions of said circuit pattern.

16. A process according to claim 15 wherein said second circuit pattern image is formed on said first layer by screen printing.

17. A process according to claim 15 wherein one or more additional layers are fabricated on each side of said first board by repeating the steps employed in fabrication of said second layer.

18. A process according to claim 15 wherein said curable resinous material employed in said suspension of cuprous oxide is an epoxy derivative of Bisphenol A.

19. A process according to claim 15 wherein said chemical reduction is carried out using an aqueous solution comprising dimethylaminoborane or an alkali metal borohydride.

20. A process according to claim 19 wherein the chemical reduction is carried out using an aqueous alkaline solution of dimethylaminoborane.

21. A process according to claim 15 wherein said curing of said curable resinous material is carried out by heating said material.

22. A multilayer printed circuit board fabricated in accordance with the process of claim 1.

23. A multilayer printed circuit board fabricated in accordance with the process of claim 7.

24. A multilayer printed circuit board fabricated in accordance with the process of claim 15.

25. A multilayer printed circuit board comprising an inner layer formed by:
   providing a copper clad substrate with holes drilled therethrough, said holes being plated with copper;
   forming on one side of said substrate a resist image of a circuit pattern on said copper coated substrate;
   removing all copper from the areas not covered by said resist;
   removing said resist;
   applying a dielectric mask to selected areas of said circuit pattern so exposed;
   and repeating the above sequence of steps to produce a circuit pattern on the other side of said substrate;
   and having a plurality of additional printed circuit layers on each side of said inner layer, each of said additional layers having been formed in situ on the previous layer in a predetermined mode of registration therewith by:
   providing on said previous layer a circuit pattern image formed using a suspension of cuprous oxide in a curable resinous material;
   curing said image;
   subjecting said image to chemical reduction to convert at least a portion of said cuprous oxide to copper;
   electrolessly plating said image with copper; and
   applying a dielectric mask to selected portions of said circuit pattern.

26. A multilayer printed circuit board in accordance with claim 25 wherein said copper clad substrate employed to form said inner layer is obtained by coating a non-conductive substrate having through-holes drilled therein with a layer of a suspension of cuprous oxide particles in a curable resinous material on each side of the substrate, heat curing said layers, subjecting said layers to chemical reduction to convert the cuprous oxide to metallic copper in the surfaces of said layers, and thereafter electrolessly plating said surfaces with copper.

27. A multilayer printed circuit board wherein the dielectric layer or layers separating the individual layers of circuitry is comprised of a suspension of cuprous oxide particles in a thermoset resin.

28. A process for fabricating a multilayer printed circuit board which comprises:
   coating a non-conductive substrate with a layer of a suspension of cuprous oxide in a curable resinous material;
   at least partially curing said layer of resinous material;
   coating said layer of resinous material with a photoresist;
   exposing said photoresist imagewise to actinic radiation;
   developing the resulting image;
   chemically reducing the cuprous oxide particles in the surface of said layer of resinous material not protected by said photoresist;
   electrolessly plating with copper said surface not protected with photoresist; and
   thereafter, "forming at least one additional layer of said cuprous oxide suspended in said resinous material,; at least partially curing said layer of resinous material; coating said layer of resinous material with a photoresist; exposing said photoresist imagewise to actinic radiation; developing the resulting image; chemically reducing the cuprous oxide particles in the surface of said layer of resinous material not protected by said photoresist such that the unreduced portion of said cuprous oxide particles in said curable resinous material serves as a dielectric layer; electrolessly plating with copper said surface not protected with photoresist".

* * * * *